United States Patent [19]
Shim et al.

[11] Patent Number: 6,004,858
[45] Date of Patent: Dec. 21, 1999

[54] METHODS OF FORMING HEMISPHERICAL GRAINED SILICON (HSG-SI) CAPACITOR STRUCTURES INCLUDING PROTECTIVE LAYERS

[75] Inventors: Se-jin Shim, Seoul; Young-sun Kim, Kyungki-do; Cha-young Yoo, Kyungki-do; Young-wook Park, Kyungki-do, all of Rep. of Korea

[73] Assignee: Samsung Electronics Co., Ltd., Rep. of Korea

[21] Appl. No.: 08/988,858

[22] Filed: Dec. 11, 1997

[51] Int. Cl.⁶ ................................................. H01L 21/20
[52] U.S. Cl. .......................................... 438/398; 257/309
[58] Field of Search .................................. 438/397, 398, 438/393, 399

[56] References Cited

U.S. PATENT DOCUMENTS

| | | | |
|---|---|---|---|
| 5,234,862 | 8/1993 | Aketagawa et al. | 438/448 |
| 5,366,917 | 11/1994 | Watanabe et al. | 438/398 |
| 5,372,962 | 12/1994 | Hirota et al. | 438/398 |
| 5,385,863 | 1/1995 | Tatsumi et al. | 438/398 |
| 5,394,012 | 2/1995 | Kimura | 257/739 |
| 5,405,801 | 4/1995 | Han et al. | 438/356 |
| 5,447,878 | 9/1995 | Park et al. | 438/396 |
| 5,464,791 | 11/1995 | Hirota | 438/253 |
| 5,543,347 | 8/1996 | Kawano et al. | 438/660 |
| 5,554,557 | 9/1996 | Koh | 438/396 |
| 5,567,637 | 10/1996 | Hirota | 438/593 |
| 5,586,488 | 1/1996 | Kamiyama | 438/396 |
| 5,590,051 | 12/1996 | Yokozawa | 364/528.01 |
| 5,595,937 | 1/1997 | Mikagi | 438/626 |
| 5,616,511 | 4/1997 | Hirota | 438/396 |
| 5,622,889 | 4/1997 | Yoo et al. | 438/397 |
| 5,623,243 | 4/1997 | Watanabe et al. | 257/309 |
| 5,763,286 | 6/1998 | Figura et al. | 438/398 |
| 5,798,280 | 8/1998 | Matthews et al. | 438/565 |

FOREIGN PATENT DOCUMENTS

4286151A  10/1992  Japan .

OTHER PUBLICATIONS

H. Watanabe et al., An Advanced Fabrication Technology of Hemispherical Grained (HSG) Poly–Si for High Capacitance Storage Electrodes, Extended Abstracts of the 1991 International Conference on Solid State Devices and Materials, Yokohama, 1991, pp. 478–480.

H. Watanabe et al., Hemispherical Grained Silicon (HSG–Si) Formation On In–Situ Phosphorous Doped Amorphous–Si Using The Seeding Method, Extended Abstracts of the 1992 International Conference on Solid State Devices and Materials, Tsukuba, 1992, pp. 422–424.

H. Watanabe et al., A New Cylindrical Capacitor Using Hemispherical Grained Si (HSG–Si) for 256Mb DRAMs, 1992 IEEE, IEDM, 10.1.1–10.1.4, pp. 259–262.

Sakao, M., A Capacitor–Over–Bit–Line (COB) Cell With a Hemispherical–Grain Storage Node for 64Mb DRAMs, *IEDM 90–655, IEEE*, pp. 27.3.1.–27.3.4 (1990).

*Primary Examiner*—Wael Fahmy
*Assistant Examiner*—William David Coleman
*Attorney, Agent, or Firm*—Myers Bigel Sibley & Sajovec

[57] ABSTRACT

A method of forming a capacitor structure includes the steps of forming a conductive layer on a microelectronic substrate, and forming a first hemispherical grained silicon layer on the conductive layer opposite the substrate. A protective layer is formed on the hemispherical grained silicon layer. The protective layer, the first hemispherical grained silicon layer, and the conductive layer are then patterned so that portions of the microelectronic substrate are exposed adjacent the patterned conductive layer. A second hemispherical grained silicon layer is formed on the surface of the protective layer opposite the first hemispherical grained silicon layer, on sidewalls of the patterned conductive layer, and on the exposed portions of the microelectronic substrate. Portions of the second hemispherical grained silicon layer are removed from the exposed portions of the microelectronic substrate, and the patterned protective layer is then removed.

29 Claims, 4 Drawing Sheets

ION IMPLANTATION 6,004,858

METHODS OF FORMING HEMISPHERICAL GRAINED SILICON (HSG-SI) CAPACITOR STRUCTURES INCLUDING PROTECTIVE LAYERS

FIELD OF THE INVENTION

The present invention relates to the field of microelectronics and more particularly to methods of forming microelectronic capacitor structures.

BACKGROUND OF THE INVENTION

As dynamic random access memory (DRAM) devices become more highly integrated, the area of the substrate available for each memory cell is reduced. A predetermined memory cell capacitance, however, should be maintained despite the reduced substrate area available to maintain a memory cell's reading capacity, reduce soft errors, and facilitate low voltage operation. Accordingly, there is a need to provide memory cell capacitors having a predetermined capacitance on a smaller surface area of a microelectronic substrate.

Techniques have been discussed to provide capacitor electrodes having increased surface areas on smaller portions of a microelectronic substrate. In particular, the surface area of a capacitor electrode can be increased by forming a hemispherical grained silicon (HSG-Si) layer on the electrode surface. For example, HSG silicon layers have been formed using native oxide film removal and high vacuum annealing techniques as discussed in the reference by H. Watanabe et al. entitled "An Advanced Fabrication Technology of Hemispherical Grained (HSG) Poly-Si for High Capacitance Storage Electrodes", SSDM, pp. 478–480, 1991.

According to known HSG-Si fabrication techniques, however, the formation of the HSG-Si layer may result in undesired conductive paths between storage electrodes. In addition, the resulting HSG-Si layer may be insufficiently doped thus making it difficult to obtain a desired conductivity. Accordingly, it may be necessary to remove portions of the HSG-Si layer between storage electrodes. In particular, an etch-back step can be used to remove portions of the HSG-Si layer between the storage electrodes. The etch-back step, however, may damage portions of the HSG-Si layer on the storage electrodes and reduce a surface area thereof.

The dopant concentration of the HSG-Si layer can also affect the reliability of the resulting capacitor. In particular, an HSG-Si layer with an insufficient conductivity may result in an undesired variation in the C-V characteristics of the capacitor by lowering the ratio of Cmin to Cmax (Cmin/Cmax). For example, the capacitance may be at a minimum (Cmin) when a positive voltage is applied to a storage electrode with an insufficient concentration of an N-type dopant, and at a maximum (Cmax) when a negative voltage is applied to the storage electrode. Accordingly, the ratio of Cmin to Cmax may be reduced thus reducing the reliability of the capacitor.

SUMMARY OF THE INVENTION

It is therefore an object of the present invention to provide improved methods of forming capacitor electrode structures.

It is another object of the present invention to provide capacitors having an increased ratio of Cmin/Cmax.

It is still another object of the present invention to provide memory devices having improved performance.

These and other objects are provided according to the present invention by methods including the steps of forming a conductive layer on a microelectronic substrate and forming a first hemispherical grained silicon layer on the conductive layer opposite the substrate. A protective layer is formed on the hemispherical grained silicon layer. The protective layer, the first hemispherical grained silicon layer, and the conductive layer are then patterned so that portions in the microelectronic substrate are exposed adjacent the patterned conductive layer. A second hemispherical grained silicon layer is formed on the surface of the protective layer opposite the first hemispherical grained silicon layer, on sidewalls of the patterned conductive layer, and on the exposed portions of the microelectronic substrate. Portions of the second hemispherical grained silicon layer are then removed from the exposed portions of the microelectronic substrate, and the patterned protective layer is then removed. Accordingly, the first hemispherical grained silicon layer is protected during the step of removing portions of the second hemispherical grained silicon layer from the microelectronic substrate.

The method can also include the step of implanting dopants into the first hemispherical grained silicon layer thereby increasing a dopant concentration of the hemispherical grained silicon layer. The ratio of Cmin/Cmax can thus be increased. In particular, the dopants can be implanted at a dose in the range of $1 \times 10^{15}$ to $3 \times 10^5$ ions/cm$^2$ and at an energy in the range of 30 to 45 KeV. Moreover, these implanted dopants can be N-type dopants.

The protective layer can be an oxide layer having a thickness in the range of approximately 500 to 2,500 Angstroms. The conductive layer can be a doped conductive layer such as a doped polysilicon layer. In addition, the step of forming the conductive layer can be followed by the step of ion implanting dopants into the conductive layer.

Moreover, the patterning step can include forming a masking layer on the protective layer; removing portions of the protective layer, the first hemispherical grained silicon layer, and the conductive layer exposed by the masking layer; and removing the masking layer. In addition, the step of forming the masking layer can include forming a polysilicon layer on the protective layer, and forming a patterned photoresist layer on the polysilicon layer. Portions of the polysilicon layer exposed by the patterned photoresist layer are then etched. The method can also include the steps of forming a buffer layer on the remaining portions of the first and second hemispherical grained silicon layers, implanting dopants into the remaining portions of the hemispherical grained silicon layers, and removing the layer after the implanting step. The buffer layer can reduce damage to the hemispherical grained silicon layer which may result during the implant step.

The capacitor structure of the present invention can thus be used to provide capacitor storage electrodes having increased surface areas. Accordingly, capacitors including these structures can have an increased capacitance on a reduced area of a substrate. Accordingly, these capacitor structures can be used to provide improved memory devices.

DETAILED DESCRIPTION

Figure 1A:
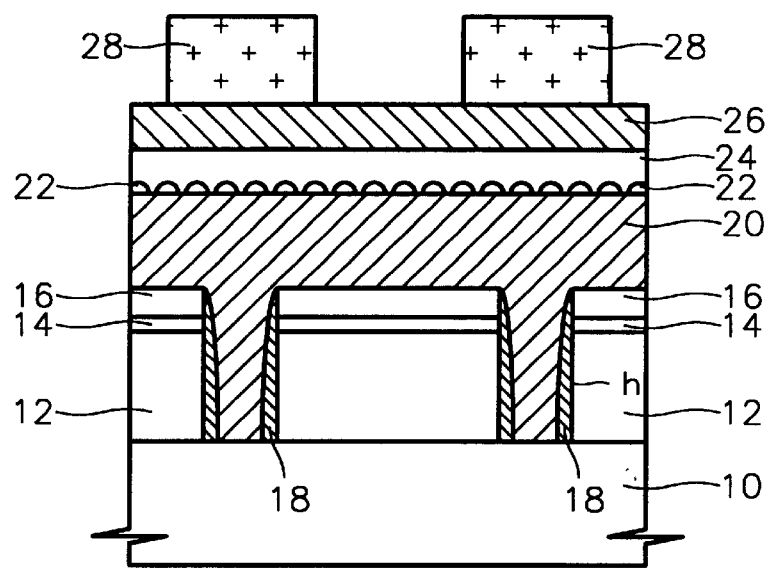
FIGS. 1A through 1E are cross-sectional views illustrating steps of a first method of forming a storage electrode having a hemispherical grained silicon layer according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

FIG. 1A through 1E illustrate steps of a first method of forming a storage electrode having a hemispherical grained silicon layer according to the present invention. In particular, a memory cell transistor can be formed on a substrate 10, and a planarized insulating layer 12 can be formed on the substrate 10 and on the memory cell transistor. A contact hole is formed through the insulating layer 12 exposing a source/drain region of the memory cell transistor in the substrate 10. In addition, an etch stop layer 14 such as a silicon nitride (SiN) layer can be formed on the planarized insulating layer 12, and an insulating layer 16 such as a high temperature oxide (HTO) layer can be formed on the etch stop layer 14. As shown, the contact hole h extends through each of the etch stop layer 14 and the insulating layer 16 as well as the insulating layer 12. A single etch step can be used to form the contact hole h through each of these layers. Furthermore, insulating spacers 18 can be formed along the sidewalls of the contact hole h as shown in FIG. 1A.

The etch stop layer 14 is preferably formed of a material having an etch rate lower than that of the insulating layer 16 so that the planarized insulating layer 12 is not significantly etched during a wet etch used to remove the insulating layer 16. Generally, the etch stop layer 14 is formed of a material having an etch rate significantly lower than that of the insulating layer 16.

The insulating spacers 18 can be formed by depositing a layer of an insulating material such as silicon nitride (SiN) on the insulating layer 16 and on the sidewalls of the contact hole h. This insulating layer is then anistropically etched to form the spacers 18 along the sidewalls of the contact hole. A layer of a conductive material such as a doped polysilicon layer is then deposited on the insulating layer 16 and in the contact hole h to provide the conductive layer 20 as shown in FIG. 1A. This conductive layer 20 is later patterned to provide the storage electrodes. A first HSG-Si layer 22 is formed on the conductive layer 20 as shown in FIG. 1A. In particular, this HSG-Si layer is formed before patterning the conductive layer 20.

A relatively high concentration of dopants can be implanted into the conductive layer 20 prior to the formation of the first HSG-Si layer 22. A relatively high concentration of dopants can then be diffused into the first HSG-Si layer 22. The first HSG-Si layer 22 can be formed by chemical vapor deposition (CVD) using silane ($SiH_4$) or disilane ($Si_2H_6$) as a source gas. The first HSG-Si layer 22 is preferably formed to a thickness in the range of 300 Angstroms to 800 Angstroms.

A layer of an insulating material such as a high temperature oxide (HTO) is then deposited on the first HSG-Si layer 22 to provide a protective layer 24. In addition, a polysilicon layer can be deposited on the protective layer 24 to provide a mask layer 26. A mask layer 26 can have a thickness in the range of 300 Angstroms to 1,500 Angstroms. The mask layer 26 preferably has a thickness of approximately 500 Angstroms. A photoresist layer is then formed on the mask layer 26 and patterned to form the photoresist pattern 28 as shown in FIG. 1A. Alternately, the polysilicon mask layer 26 can be omitted.

The protective layer 24 reduces damage to the first HSG-Si layer 22 when removing conductive material between the storage electrodes. More particularly, the protective layer 24 protects the HSG-Si layer 22 when patterning the storage electrodes. The protective layer 26 preferably has a thickness in the range of 500 Angstroms to 2,500 Angstroms. More preferably, the protective layer 24 has a thickness of approximately 1,500 Angstroms.

Figure 1B:
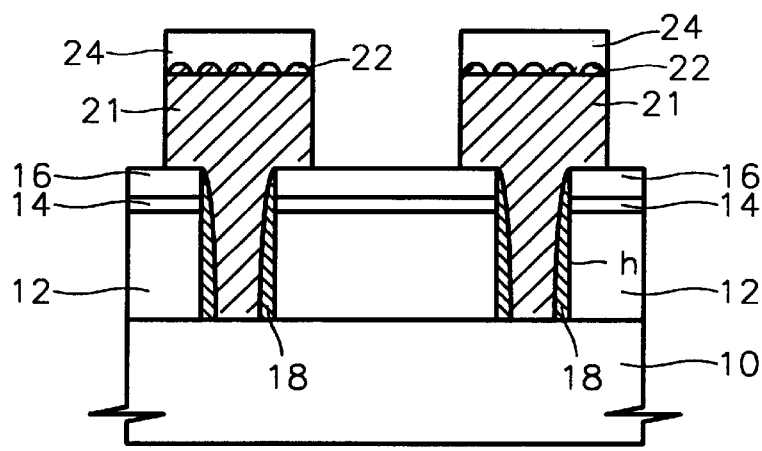

The step of patterning the conductive layer 20 to form the storage electrodes 21 is illustrated in FIG. 1B. In particular, the mask layer 26, the protective layer 24, the first HSG-Si layer 22, and the conductive layer 20 are selectively etched using the photoresist pattern 28 as an etching mask. The storage electrodes 21 are thus formed. The photoresist pattern 28 and the mask layer 26 can then be removed.

Figure 1C:
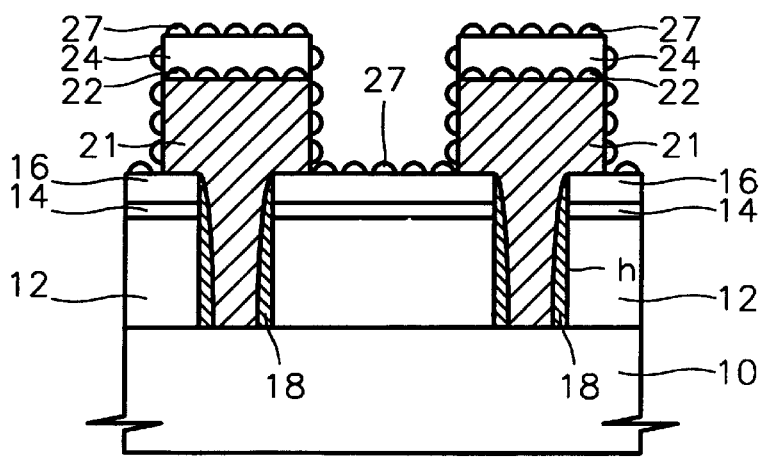
Figure 1D:
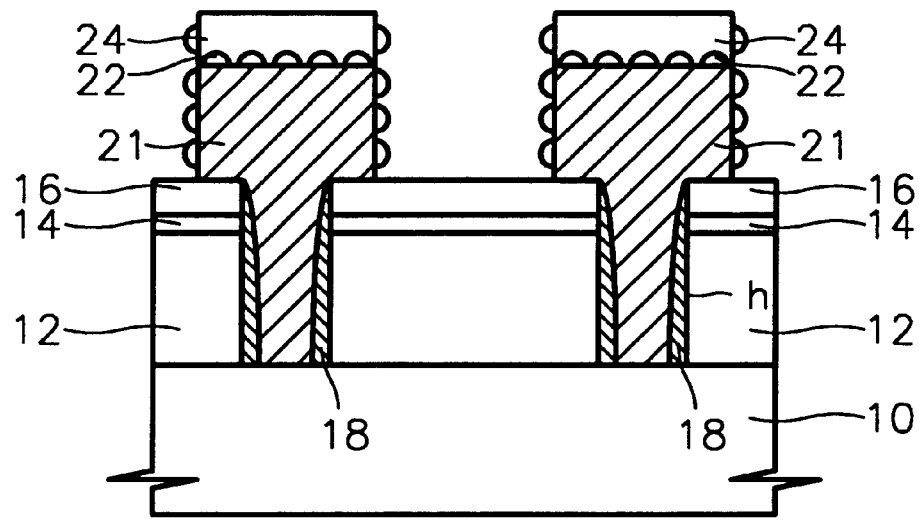
Figure 1E:
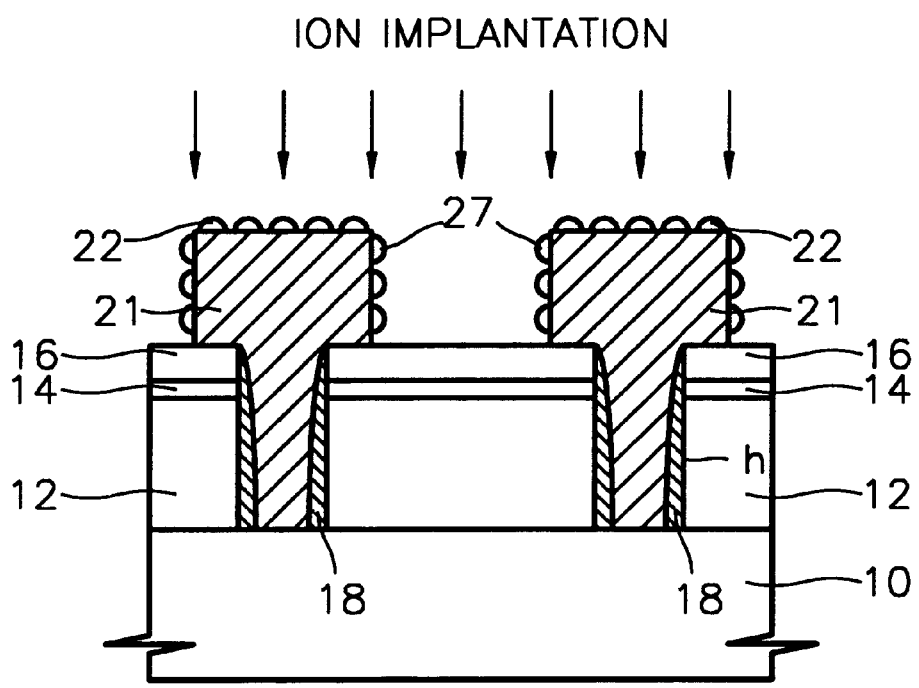

A second HSG-Si layer 27 is then formed as shown in FIG. 1C. The second HSG-Si layer 27 can be formed on the exposed portions of the insulating layer 16, the storage electrodes 21, and the protective layer 24. Portions of the second HSG-Si layer 27 on the surface of the insulating layer 16 and on the surface of the protective layer 24 are then removed as shown in FIG. 1D. In particular, portions of the second HSG-Si layer 27 can be removed from between the storage electrodes 21 using an etch-back step to reduce the generation of conductive bridges between the storage electrodes 21. Portions of the second HSG-Si layer 27 on the surface of the protective layer 24 may also be removed. In particular, the etch-back step can be performed using a dry etch step.

Portions of the first HSG-Si layer 22 on the top surface of the storage electrode 21, however, are protected by the protective layer 24 during the etch-back step. Accordingly, the surface area of the first HSG-Si layer 22 on the top surface of the storage electrode 21 is maintained during the step of removing portions of the second HSG-Si layer from the insulating layer 16. In other words, damage to the first HSG-Si layer is reduced using the protective layer.

The protective layer 24 is then removed, and dopants such as high-concentration N-type dopants are implanted into the resulting structure. Accordingly, the implant step can be used to dope the remaining portions of the first and second HSG-Si layers 22 and 27. The dopants are preferably implanted at a dose in the range of $1 \times 10^{15}$ to $3 \times 10^{15}$ ions/cm$^2$ and at an implant energy in the range of 30–45 KeV. This implant provides sufficient conductivity for the first and second HSG-Si layers 22 and 27. Accordingly, the ratio Cmin/Cmax can be increased. The surface area of the storage electrode 21 can be further increased by etching the insulating layer 16 to expose lower portions of the electrode 21. The insulating layer 16 and the protective layer 24 can be etched simultaneously. Moreover, the etch stop layer 14 protects the insulating layer 12 when etching the insulating layer 16. Furthermore, a dielectric layer can be formed on the HSG-Si layers 22 and 27, and a second conductive layer can be formed on the dielectric layer.

According to the method discussed above with reference to FIGS. 1A through 1E, the dopant concentration of the HSG-Si layer can be sufficiently increased using an ion implant step wherein dopants are implanted directly into the surface of the HSG-Si layers. Accordingly, the value of Cmin/Cmax can be increased thus increasing the reliability of the capacitor. Moreover, the performance and reliability of memory devices including the electrode structures can be improved.

Figure 2A:
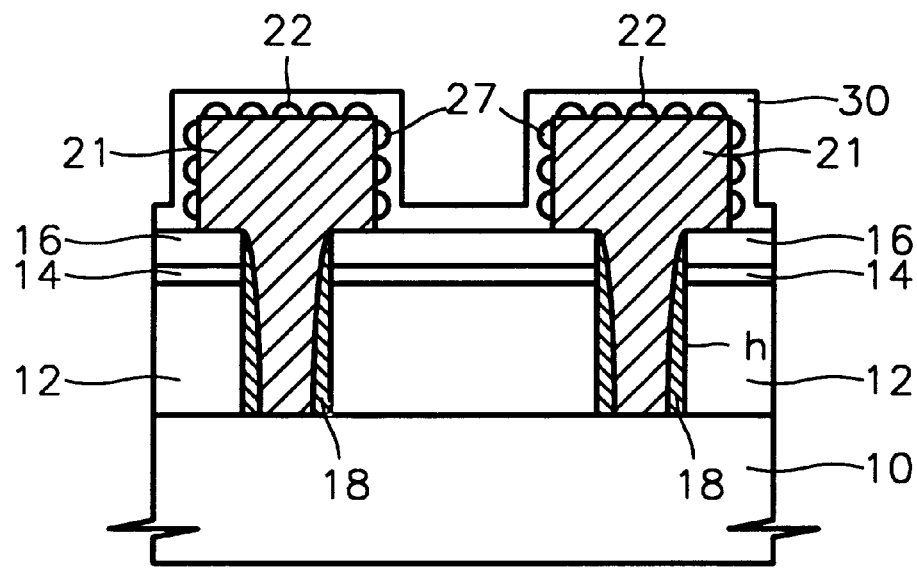
FIGS. 2A through 2C are cross-sectional views illustrating steps of a second method of forming a storage electrode having a hemispherical grained silicon layer according to the present invention.
Figure 2B:
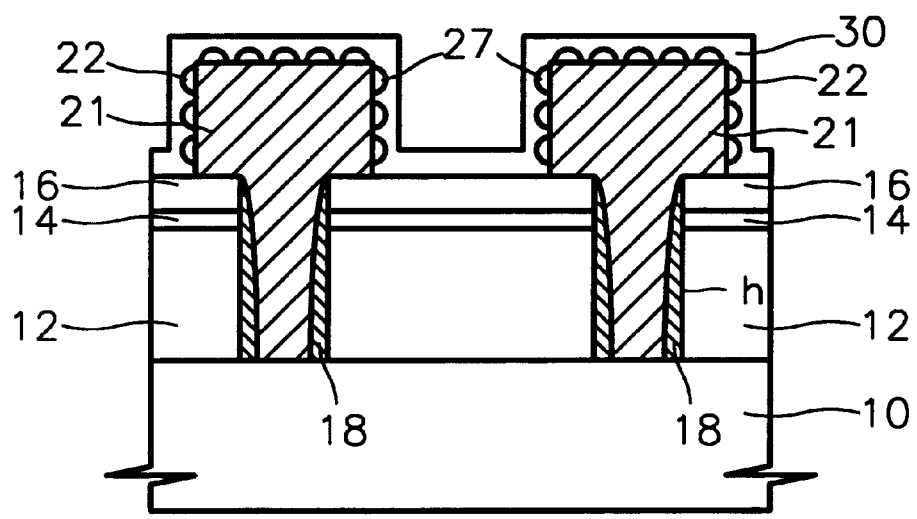
Figure 2C:
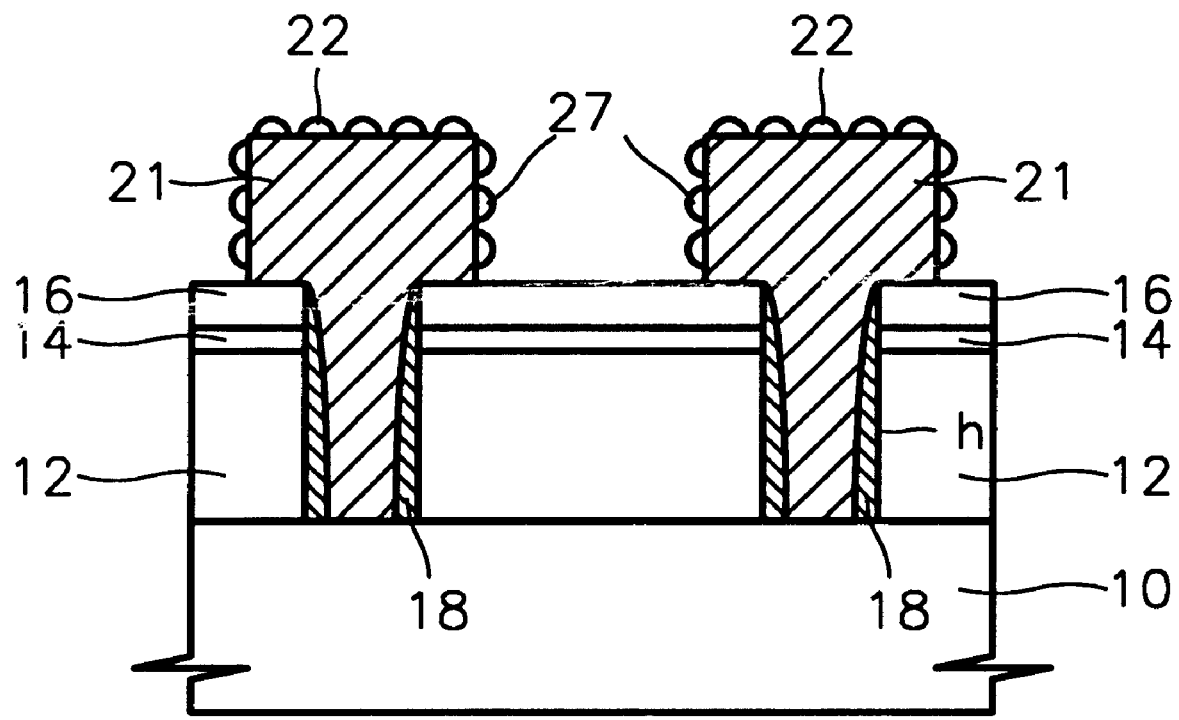

A second method of forming a storage electrode according to the present invention will now be discussed with reference to FIGS. 2A through 2C. In FIGS. 2A through 2C, the reference numerals common to those in FIGS. 1A through 1E designate the same elements. Moreover, the steps of forming the insulating layer 12, the etch stop layer 14, the insulating layer 16, the contact hole h, the insulating spacers 18, the storage electrodes 21, and the HSG-Si layers 22 and 27 are the same as those discussed above with regard to FIGS. 1A through 1E. In the second method of FIGS. 2A through 2C, however, a buffer layer 30 is added prior to the implant step.

As shown in FIG. 2A, the steps of the first method are performed up to the step of removing the second HSG-Si layer 27 from between the storage electrodes 21 and removing the protective layer 24. A layer of an insulating material such as high temperature oxide (HTO) is then deposited on the HSG-Si silicon layers 22 and 27 and on the exposed portions of the insulating layer 16 as shown in FIG. 2A. This layer of insulating material provides the buffer layer 30. This buffer layer 30 reduces damage to the HSG-Si layer during the step of implanting dopants into the HSG-Si layers 22 and 27. The buffer layer 30 may be a layer formed using a plasma-enhanced-tetraethyloxysilicate (PE-TEOS) technique, a plasma-enhanced silane (PE-SiH$_4$) technique, or a high temperature oxidation (HTO) technique. The buffer layer 30 can have a thickness in the range of 10 Angstroms to 200 Angstroms.

Dopants are then implanted into the HSG-Si layers 22 and 27 as shown in FIG. 2B. In particular, a high concentration of N-type dopants can be implanted through the buffer layer 30 into the HSG-Si layers 22 and 27 thereby increasing the dopant concentrations thereof. The dopants are preferably implanted at a dose in the range of $1 \times 10^{15}$ to $3 \times 10^{15}$ ions/cm$^2$ and at an implant energy in the range of 30–45 KeV. The buffer layer 30 is then removed as shown in FIG. 2C. In addition, a dielectric layer can be formed on the HSG-Si layers 22 and 27, and a second conductive layer can be formed on the dielectric layer. According to the method discussed above with reference to FIGS. 2A–2C, dopants can be implanted into the HSG-Si layer through a buffer layer 30. The ratio of Cmin/Cmax can thus be increased, and damage to the HSG-Si layer as a result of ion implantation can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a capacitor structure, said method comprising the steps of:

forming a conductive layer on a microelectronic substrate;

forming a first hemispherical grained silicon (HSG-Si) layer on said conductive layer opposite said substrate;

forming a protective layer on said first hemispherical grained silicon layer;

patterning said protective layer, said first hemispherical grained silicon layer, and said conductive layer to expose sidewalls of said conductive layer;

forming a second hemispherical grained silicon layer on the exposed sidewalls of said patterned conductive layer;

removing said patterned protective layer; and after said step of removing said patterned protective layer, implanting dopants into said first and second hemispherical grained silicon layers wherein said implanted dopants comprise N-type dopants.

2. A method according to claim 1 wherein portions of said substrate are exposed adjacent said exposed sidewalls of said conductive layer during said patterning step, wherein said second hemispherical grained silicon layer is formed on said exposed portions of said substrate, and wherein said step of removing said patterned protective layer is preceded by the step of removing portions of said second hemispherical grain silicon layer from said exposed portions of said substrate.

3. A method according to claim 1 wherein said protective layer comprises an oxide.

4. A method according to claim 1 wherein said protective layer has a thickness in the range of approximately 500 to 2500 Angstroms.

5. A method according to claim 1 wherein said conductive layer comprises a doped conductive layer.

6. A method according to claim 1 wherein said step of forming said conductive layer is followed by the step of ion-implanting dopants into said conductive layer.

7. A method according to claim 1 wherein said patterning step comprises:

forming a masking layer on said protective layer;

etching portions of said protective layer, said first hemispherical grained silicon layer, and said conductive layer exposed by said masking layer; and removing said masking layer.

8. A method according to claim 7 wherein said step of forming said mask comprises:

forming a polysilicon layer on said protective layer;

forming a patterned photoresist layer on said polysilicon layer; and etching portions of said polysilicon layer exposed by said patterned photoresist layer.

9. A method according to claim 1 further comprising the steps of:

forming a dielectric layer on said hemispherical grained silicon layers; and forming a conductive layer on said dielectric layer.

10. A method of forming a capacitor structure, said method comprising the steps of:

forming a conductive layer on a microelectronic substrate;

forming a first hemispherical grained silicon (HSG-Si) layer on said conductive layer opposite said substrate;

forming a protective layer on said first hemispherical grained silicon layer;

patterning said protective layer, said first hemispherical grained silicon layer, and said conductive layer to expose sidewalls of said conductive layer;

forming a second hemispherical grained silicon layer on the exposed sidewalls of said patterned conductive layer;

removing said patterned protective layer; and after said step of removing said patterned protective layer, implanting dopants into said first and second hemispherical grained silicon layers wherein said dopants are implanted at a dose in the range of $1 \times 10^{15}$ to $3 \times 10^{15}$ ions/cm$^2$ and at an energy in the range of approximately 30 to 45 KeV.

11. A method of forming a capacitor structure, said method comprising the steps of:
   forming a conductive layer on a microelectronic substrate;
   forming a first hemispherical grained silicon (HSG-Si) layer on said conductive layer opposite said substrate;
   forming a protective layer on said first hemispherical grained silicon layer;
   patterning said protective layer, said first hemispherical grained silicon layer, and said conductive layer to expose sidewalls of said conductive layer;
   forming a second hemispherical grained silicon layer on the exposed sidewalls of said patterned conductive layer;
   removing said patterned protective layer;
   after said step of removing said protective layer, forming a buffer layer on remaining portions of said first and second hemispherical grained silicon layers;
   implanting dopants into said remaining portions of said hemispherical grained silicon layers through said buffer layer; and
   removing said buffer layer after said implanting step.

12. A method according to claim 11 wherein said dopants are implanted at a dose in the range of $1\times10^{15}$ to $3\times10^{15}$ ions/cm$^2$ and at an energy in the range of approximately 30 to 45 KeV.

13. A method according to claim 11 wherein said buffer layer comprises an oxide formed by a technique chosen from the group consisting of high temperature oxidation technique, a plasma-enhanced-tetraethyloxysilicate (PE-TEOS) technique, and plasma-enhanced silane (PE-SiH$_4$) technique.

14. A method according to claim 11 wherein said buffer layer comprises an oxide layer.

15. A method of forming a microelectronic memory device, said method comprising the steps of:
   forming a memory cell transistor on a microelectronic substrate;
   forming an insulating layer on said microelectronic substrate and on said memory cell transistor wherein said insulating layer has a contact hole therethrough exposing a source/drain region of said memory cell transistor;
   forming a conductive layer on said insulating layer opposite said substrate wherein said conductive layer is electrically coupled with said source/drain region through said contact hole;
   forming a first hemispherical grained silicon (HSG-Si) layer on said conductive layer opposite said substrate;
   forming a protective layer on said hemispherical grained silicon layer;
   patterning said protective layer, said first hemispherical grained silicon layer, and said conductive layer so that portions of said insulating layer are exposed adjacent said patterned conductive layer and so that said patterned conductive layer is electrically coupled with said source/drain region through said contact hole;
   forming a second hemispherical grained silicon layer on sidewalls of said patterned conductive layer;
   removing said patterned protective layer;
   forming a dielectric layer on said hemispherical grained silicon layers;
   forming a conductive layer on said dielectric layer; and
   after said step of removing said patterned protective layer, implanting dopants into said first and second hemispherical grained silicon layers wherein said dopants are implanted at a dose in the range of $1\times10^{15}$ to $3\times10^{15}$ ions/cm$^2$ and at an energy in the range of approximately 30 to 40 KeV.

16. A method of forming a microelectronic memory device, said method comprising the steps of:
   forming a memory cell transistor on a microelectronic substrate;
   forming an insulating layer on said microelectronic substrate and on said memory cell transistor wherein said insulating layer has a contact hole therethrough exposing a source/drain region of said memory cell transistor;
   forming a conductive layer on said insulating layer opposite said substrate wherein said conductive layer is electrically coupled with said source/drain region through said contact hole;
   forming a first hemispherical grained silicon (HSG-Si) layer on said conductive layer opposite said substrate;
   forming a protective layer on said hemispherical grained silicon layer;
   patterning said protective layer, said first hemispherical grained silicon layer, and said conductive layer so that portions of said insulating layer are exposed adjacent said patterned conductive layer and so that said patterned conductive layer is electrically coupled with said source/drain region through said contact hole;
   forming a second hemispherical grained silicon layer on sidewalls of said patterned conductive layer;
   removing said patterned protective layer;
   forming a dielectric layer on said hemispherical grained silicon layers;
   forming a conductive layer on said dielectric layer; and
   after said step of removing said patterned protective layer, implanting dopants into said first and second hemispherical grained silicon layers wherein said implanted dopants comprise N-type dopants.

17. A method according to claim 16 wherein said second hemispherical grained silicon layer is formed on said exposed portions of said insulating layer and wherein said step of removing said patterned protective layer is preceded by the step of removing portions of said second hemispherical grain silicon layer from said exposed portion of said insulating layer.

18. A method according to claim 16 wherein said protective layer comprises an oxide.

19. A method according to claim 16 wherein said protective layer has a thickness in the range of approximately 500 to 2500 Angstroms.

20. A method of forming a microelectronic memory device, said method comprising the steps of:
   forming a memory cell transistor on a microelectronic substrate;
   forming an insulating layer on said microelectronic substrate and on said memory cell transistor wherein said insulating layer has a contact hole therethrough exposing a source/drain region of said memory cell transistor;
   forming a conductive layer on said insulating layer opposite said substrate wherein said conductive layer is electrically coupled with said source/drain region through said contact hole;
   forming a first hemispherical grained silicon (HSG-Si) layer on said conductive layer opposite said substrate;

forming a protective layer on said hemispherical grained silicon layer;

patterning said protective layer, said first hemispherical grained silicon layer, and said conductive layer so that portions of said insulating layer are exposed adjacent said patterned conductive layer and so that said patterned conductive layer is electrically coupled with said source/drain region through said contact hole;

forming a second hemispherical grained silicon layer on sidewalls of said patterned conductive layer;

removing said patterned protective layer;

after said step of removing said protective layer, forming a buffer layer on remaining portions of said first and second hemispherical grained silicon layers;

implanting dopants into said remaining portions of said hemispherical grained silicon layers through said buffer layer; and removing said buffer layer after said implanting step;

after said step of removing said buffer layer, forming a dielectric layer on said hemispherical grained silicon layers; and forming a conductive layer on said dielectric layer.

21. A method according to claim 20 wherein said dopants are implanted at a dose in the range of $1\times10^{15}$ to $3\times10^{15}$ ions/cm$^2$ and at an energy in the range of approximately 30 to 40 KeV.

22. A method according to claim 20 wherein said buffer layer comprises an oxide formed by a technique chosen from the group consisting of high temperature oxidation technique, a plasma-enhanced-tetraethyloxysilicate (PE-TEOS) technique, and plasma-enhanced silane (PE-SiH$_4$) technique.

23. A method according to claim 20 wherein said buffer layer comprises an oxide layer.

24. A method of forming a capacitor structure, said method comprising the steps of:

forming a conductive layer on a microelectronic substrate;

forming a hemispherical grained silicon (HSG-Si) layer on said conductive layer opposite said substrate;

after said step of forming said hemispherical grained silicon (HSG-Si) layer, forming a buffer layer on said hemispherical grained silicon layer;

implanting dopants into said hemispherical grained silicon layer through said buffer layer; and removing said buffer layer after said implanting step.

25. A method according to claim 24 wherein said buffer layer comprises an oxide layer.

26. A method according to claim 25 wherein said dopants are implanted at a dose in the range of $1\times10^{15}$ to $3\times10^{15}$ ions/cm2 and at an energy in the range of approximately 30 to 45 KeV.

27. A method of forming a microelectronic memory device, said method comprising the steps of:

forming a memory cell transistor on a microelectronic substrate;

forming an insulating layer on said microelectronic substrate and on said memory cell transistor wherein said insulating layer has a contact hole therethrough exposing a source/drain region of said memory cell transistor;

forming a conductive layer on said insulating layer opposite said substrate wherein said conductive layer is electrically coupled with said source/drain region through said contact hole;

forming a hemispherical grained silicon (HSG-Si) layer on said conductive layer opposite said substrate;

after said step of forming said hemispherical grained silicon layer, forming a buffer layer on remaining portions of said hemispherical grained silicon layer;

implanting dopants into said hemispherical grained silicon layer through said buffer layer; and removing said buffer layer after said implanting step;

after said step of removing said buffer layer, forming a dielectric layer on said hemispherical grained silicon layers; and forming a conductive layer on said dielectric layer.

28. A method according to claim 27 wherein said buffer layer comprises an oxide layer.

29. A method according to claim 28 wherein said dopants are implanted at a dose in the range of $1\times10^{15}$ to $3\times10^5$ ions/cm$^2$ and at an energy in the range of approximately 30 to 45 KeV.

* * * * *